United States Patent
Sae-Ueng et al.

(10) Patent No.: US 7,002,331 B2
(45) Date of Patent: Feb. 21, 2006

(54) MODULAR POWER SUPPLY SYSTEM INCLUDING A POWER STATUS SIGNAL GENERATOR TO PERFORM FAST SAG DETECTION TO INPUT PEAK VOLTAGE

(75) Inventors: Sakda Sae-Ueng, Samutprakarn (TH); Suvimol-Opas Waraluk, Samutprakarn (TH); Ming Chun Xu, Samutprakarn (TH); Kuei Hsiang Tsai, Taoyuan Hsien (TW)

(73) Assignees: Delta Electronics, Inc., Taouan Hsien (TW); Delta Electronics (Thailand) Public Company, Limited, Samutprakarn (TH)

( * ) Notice: Subject to any disclaimer, the term of this patent is extended or adjusted under 35 U.S.C. 154(b) by 192 days.

(21) Appl. No.: 10/756,562

(22) Filed: Jan. 13, 2004

(65) Prior Publication Data
US 2005/0151524 A1   Jul. 14, 2005

(51) Int. Cl.
*G05F 5/00*   (2006.01)
(52) U.S. Cl. .................................................. 323/299
(58) Field of Classification Search ................ 323/268, 323/271, 282, 288, 289, 299, 303; 363/50, 363/52, 53, 82, 84, 89, 125–127
See application file for complete search history.

(56) References Cited

U.S. PATENT DOCUMENTS

| | | | | |
|---|---|---|---|---|
| 5,349,284 A | * | 9/1994 | Whittle | 323/207 |
| 5,391,976 A | * | 2/1995 | Farrington et al. | 323/207 |
| 5,790,395 A | * | 8/1998 | Hagen | 363/89 |
| 6,101,111 A | * | 8/2000 | Blair | 363/97 |
| 6,670,779 B1 | * | 12/2003 | Shen | 315/291 |

* cited by examiner

*Primary Examiner*—Matthew V. Nguyen
(74) *Attorney, Agent, or Firm*—Madson & Metcalf

(57) ABSTRACT

A modular power supply system incorporating a power status signal generator circuit to detect the voltage sag of the input peak voltage within a short period is proposed. The power status signal generator circuit mainly includes a peak detector that detects a peak value of an input voltage, wherein the peak detector comprises a first comparator that compares the input voltage with a predetermined reference voltage and sends an output signal according to a comparison result thereof, a RC network connected to the first comparator and is configured to charge and discharge the capacitor according to the output signal of the first comparator, and a second comparator connected to the resistor-capacitor network that compares a terminal voltage of the capacitor of the resistor-capacitor network with the predetermined reference voltage and generates a power status signal according to a comparison result thereof.

6 Claims, 4 Drawing Sheets

US 7,002,331 B2

MODULAR POWER SUPPLY SYSTEM INCLUDING A POWER STATUS SIGNAL GENERATOR TO PERFORM FAST SAG DETECTION TO INPUT PEAK VOLTAGE

FIELD OF THE INVENTION

The present invention is related to a modular power supply system, and more particularly to a modular power supply system including a power status signal generator circuit that can continuously monitor the power supply status of an AC power source connected to the input of the modular power supply system and detect the voltage sag problem of an input AC peak voltage within a short period.

BACKGROUND OF THE INVENTION

A typical modular power supply system is designed to receive an AC electric power from a commercially available AC power source via power lines and deliver a DC electric power to one or more load devices through appropriate power regulation steps. A modular power supply system according to the prior art is illustrated in FIG. 1. The modular power supply system 10 of FIG. 1 substantially includes an AC power source 11, an EMI filter 12, a bridge rectifier 13, and a DC—DC converter 14. The AC power source 11 is used to accommodate an input AC voltage, while the EMI filter 12 is used to suppress the electromagnetic interference components persisting in the input AC voltage. The bridge rectifier 13 is connected to the EMI filter 13 for converting the filtered AC voltage into a desired input voltage, and the DC—DC converter 14 is configured to receive the rectified input voltage from the full-wave bridge rectifier 13 and convert the input voltage into a desired output DC voltage tailored to power a load device (not shown).

Moreover, the modular power supply system 10 further includes a power status signal generator circuit 15 that can monitor the power supply status of the AC power source 11 and detect the voltage sag problem of an input peak voltage of the AC power source 11 in the event that the AC power source 11 is malfunctioned or was removed from the modular power supply system 10. The power status signal generator circuit 15 according to the prior art generally includes a half-wave rectifier 151, a RC charging/discharging network 152, a RC filter 153, and a voltage comparator 154. The AC voltage supplied by the AC power source 11 is first rectified by a half-wave rectifier 151, which is generally implemented as a diode element. Next, a RC charging/discharging network 152, constituted by a capacitor C100 and a resistor R100, is used to perform charging/discharging operation to the capacitor C100 in order to detect the peak value of the input AC voltage in terms of the voltage across the capacitor C100. A RC filter 153, connected to the RC charging/discharging network 152, acts as a second-order low pass filter to filter and smooth the voltage across the charging/discharging capacitor C100. The output of the RC filter 153 is transmitted to an inverting input terminal of the voltage comparator 154 and compared with a reference voltage Vref, so as to determine whether the peak value of the input AC voltage from the AC power source 11 has dropped below a predetermined level. If the peak value of the AC voltage is dropped below a predetermined level, the voltage comparator 154 outputs a power status signal (AC-OK signal or AC-BROWNOUT signal) indicating the AC power source 11 is working normally or the AC power source 11 is deteriorating.

As described herein, the main function of the power status signal generator circuit 15 of FIG. 1 is to detect the peak value of the input AC voltage and determine whether the peak value of the input AC voltage has dropped below a predetermined level. In a typical modular power supply system, the frequency of an input AC voltage is rated at 50 Hz, that is, the period between two adjacent peaks of the input AC voltage should be rated at 20 microseconds. If the peak value of the input AC voltage is suddenly dropped below a predetermined nominal value, it may cause the whole system to halt its operation or lead the whole system to faulty operation. In order to detect the voltage sag problem of the input AC peak voltage as quickly as possible, the power status signal generator circuit 15 is required to detect the voltage sag problem of the input AC peak voltage and send an appropriate power status signal to inform the system of the AC failure condition in response to the voltage sag detection within a short period, so that the diagnosis function of the modular power supply system can be activated to discriminate the actual cause of the defective system operation.

A common requirement of the period set to detect the voltage sag problem of an input AC peak voltage is stipulated to be a power supply cycle of the input AC voltage, that is, 20 microseconds. However, the prior art power status signal generator circuit 15 suffers from several major drawbacks so that it is unable to meet such requirement. One of the major problems stems from the RC filter 153. In order to derive a smoother voltage waveform curve, the capacitor used in the RC filter 153 is generally implemented with a bulk capacitor. In this way, a significant time delay amount introduced by the RC filter 153 will be imposed on the period set to detect the voltage sag problem. That is to say, in the event of AC failure condition, the power status signal generator circuit 15 can not determine the voltage sag problem of the input AC peak voltage and send an appropriate power status signal to the modular power supply system 10 at the instant the defective system operation occurs, but will be delayed for a considerably long time. In practical operation, this time delay amount is measured up to 100 microseconds. Under this condition, the modular power supply system 10 can not identify the actual cause of the defective system operation immediately. Such a measurable time delay amount is sometimes intolerable, and can not comply with the requirement of fast sag detection of the input AC peak voltage caused by the AC power source 11.

In view thereof, there is a tendency to develop a modular power supply system that includes a power status signal generator circuit capable of performing a fast sag detection of an input AC peak voltage. The present invention can satisfy these needs.

SUMMARY OF THE INVENTION

A major object of the present invention is to provide a modular power supply system including a power status signal generator circuit that can detect the voltage sag problem of the input AC peak voltage and send an appropriate power status signal to the modular power supply system to indicate an AC failure condition in response to the detection of the voltage sag problem within a short period.

In accordance with the present invention, a modular power supply system is disclosed, wherein the modular power supply system consists of a power source and a power status signal generator circuit connected to the power source for detecting a peak value of an input voltage received from the power source and generating a power status signal indicating a power supply status of the power source, wherein the power status signal generator circuit includes a peak detector that detects a voltage sag of a peak value of the input voltage received from the power source, wherein the peak detector comprises a first voltage comparator that compares the input voltage received from the power source with a predetermined reference voltage and sends an output signal according to a comparison result thereof, a resistor-capacitor network connected to the first voltage comparator and is configured to charge and discharge the capacitor according to the output signal of the first voltage comparator, wherein a charging time of the capacitor is shorter than a discharging time thereof, and a second voltage comparator connected to the resistor-capacitor network that compares a terminal voltage of the capacitor of the resistor-capacitor network with the predetermined reference voltage and generates a power status signal according to a comparison result thereof.

Now the foregoing and other features and advantages of the present invention will be best understood through the following descriptions with reference to the accompanying drawings, wherein:

DETAILED DESCRIPTION OF THE PREFERRED EMBODIMENT

Figure 1:
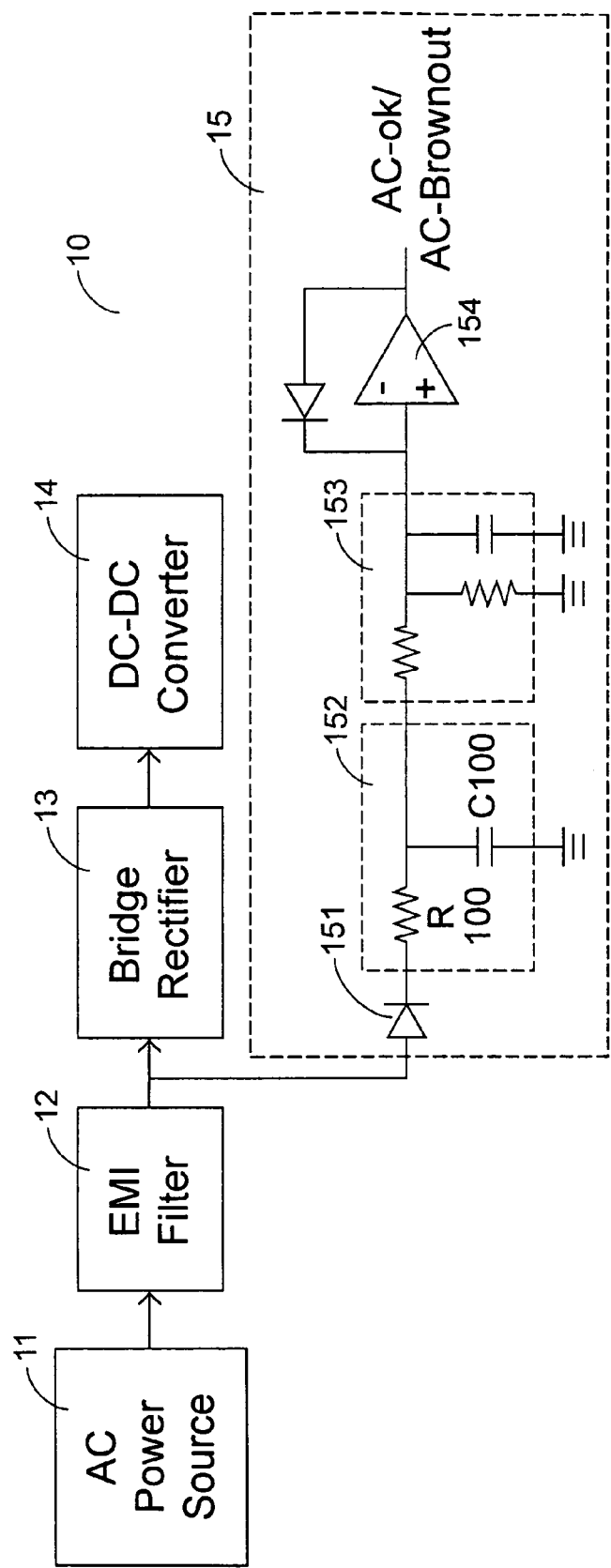
FIG. 1 is a systematic block diagram of a modular power supply system according to the prior art.
Figure 2:
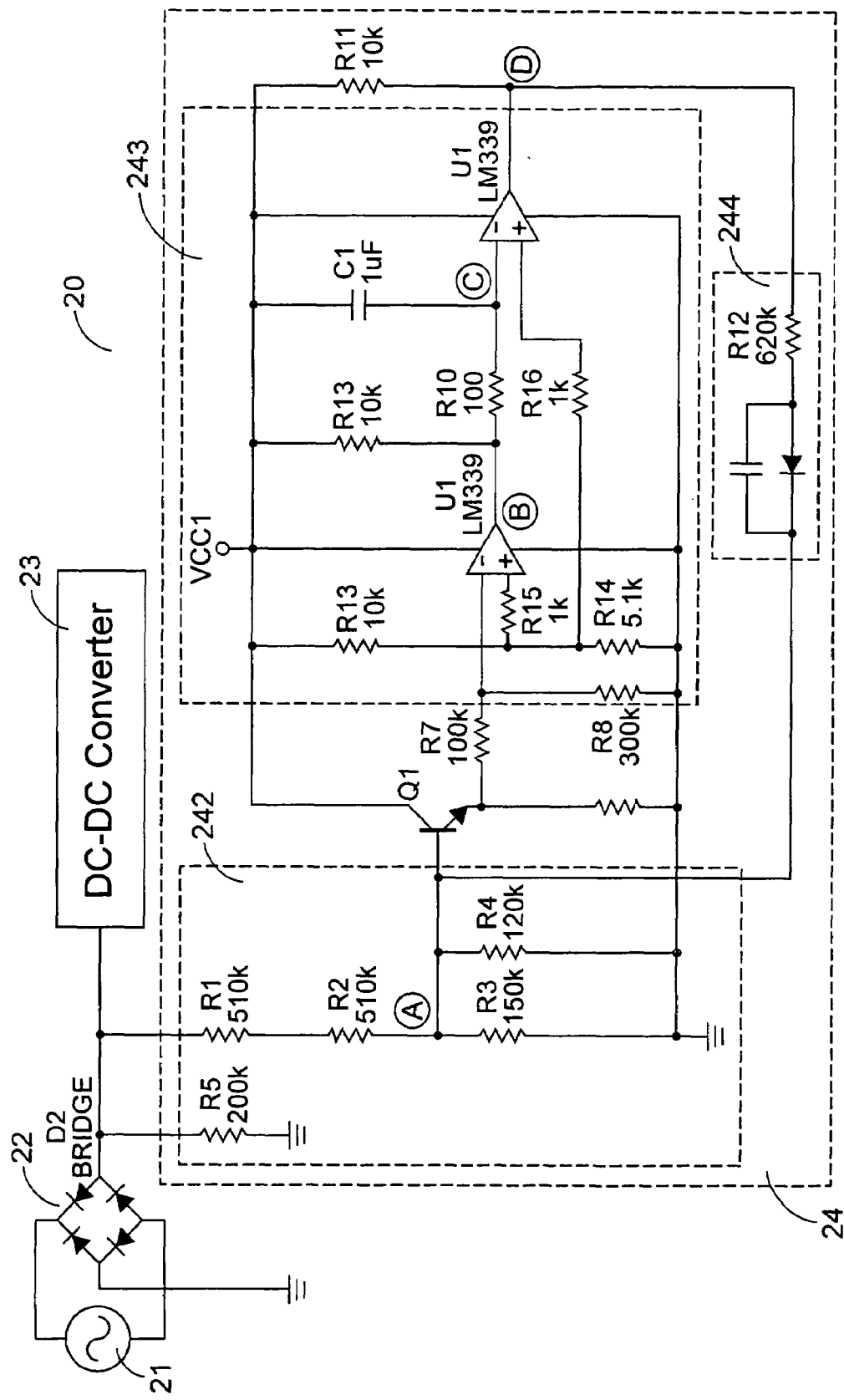
FIG. 2 is a plan view showing the circuitry for implementing the power status signal generator circuit according to a preferred embodiment of the present invention.

Referring to FIG. 2, a circuit diagram showing a preferred configuration of a modular power supply system 20 according to an embodiment of the present invention. The modular power supply system 20 of FIG. 2 includes an AC power source 21, a bridge rectifier 22 that receive an input AC voltage via power lines from the AC power source 21 and provides a rectified input voltage for the DC—DC converter 23. The bridge rectifier 22 can be alternatively configured into a half-wave rectifier or a full-wave rectifier. The DC—DC converter 23 is employed to regulate the rectified input voltage into a desired DC output voltage tailored to power a load device (not shown). Furthermore, the modular power supply system 20 incorporates a power status signal generator circuit 24 that continuously monitors the status of the AC power source 21 and provides a power status signal capable of indicating the power supply status of the AC power source 21.

As shown in FIG. 2, the power status signal generator circuit 24 is basically comprised of an attenuator 242, a peak detector 243, and a hysteresis circuit 244. The attenuator 242 is used to proportionally downscale the amplitude of the full-wave rectified input voltage receive from an output of the bridge rectifier 22 (provided the bridge rectifier 22 is a full-wave rectifier in the present embodiment), for example, 110 volts, to a lower level that is adapted for performing peak voltage detection for the input AC voltage. The hysteresis circuit 244 is connected between the peak detector 243 and the attenuator 242 and is capable of stabilizing the power status signal outputted from the circuit node D located within the peak detector 243 without causing jitters or bounces to the power status signal. As to the internal construction and the operation principle of the peak detector 243, it will be discussed in detail as follows.

Figure 3A:
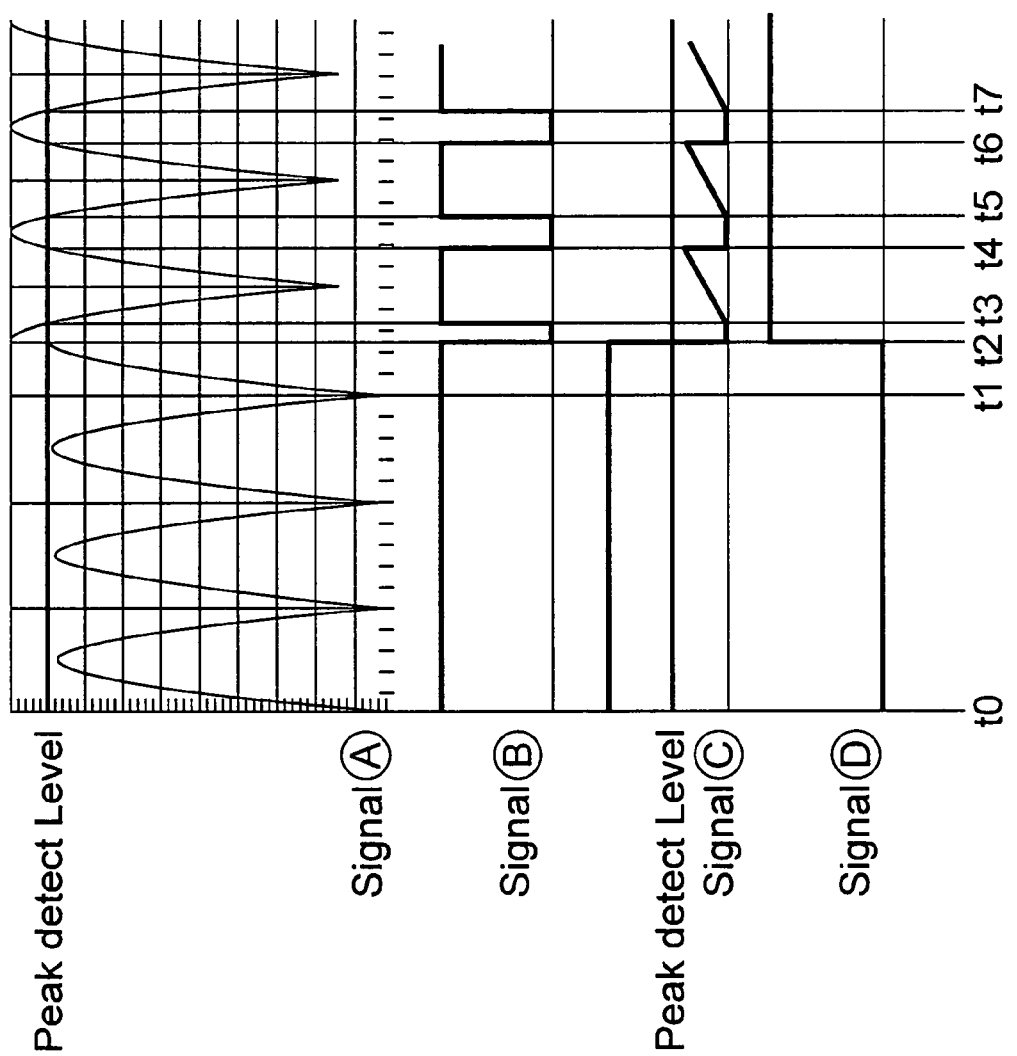
FIG. 3(a) is a timing diagram showing several signal waveforms measured at the circuit nodes within the power status signal generator circuit during the ON period of the power status signal.

Referring to FIG. 2 and FIG. 3(a), wherein FIG. 3(a) is a timing diagram showing several signal waveforms measured at the circuit nodes within the power status signal generator circuit 24 during the ON period of the power status signal (AC-OK signal is designated as the power status signal in the present embodiment) according to an embodiment of the present invention. As shown in FIG. 3(a), the signal waveform measured at the circuit node A is the raw full-wave rectified input voltage of the DC—DC converter 23, which is an AC voltage waveform with a peak voltage set at 75 Vrms, where its frequency is doubled as 100 Hz compared to the original input AC voltage supplied from the AC power source 21 because of full-wave rectification. Thus, the period within a power supply cycle, that is, the period between two adjacent peak values is rated at 10 microseconds. After being processed by the attenuator 242, the raw full-wave rectified input voltage is downscaled to a level suitable for being processed with the peak voltage detection.

In the peak detector 243, a voltage follower accomplished by a bipolar junction transistor Q1 is provided. The downscaled voltage will be coupled to an inverting terminal of a first voltage comparator U1 via the voltage follower Q1. This downscaled voltage which enters the inverting input terminal of the first voltage comparator U1 will be compared with a reference voltage being attained by the supply voltage VCC1 and the voltage divider R13, R14. The voltage comparator U1 will deliver an output signal at an output circuit node B according to the comparison result to an input terminal of a RC network comprising resistors R9, R10, and a capacitor C1. The RC network will perform a charging/discharging operation to the capacitor C1 according to the state of the output signal of the first comparator U1. A terminal voltage of charging/discharging capacitor C1 measure at the circuit node C, which is identical to remainder of the supply voltage VCC1 minus the voltage across the capacitor C1, will be delivered to an inverting terminal of a second voltage comparator U2 for performing a comparison operation with the reference voltage being derived from the supply voltage VCC1 and the voltage divider R13, R14. The second voltage comparator U2 will send an output signal according to the comparison result to the circuit node D, wherein the output signal of the second comparator U2 transmitted to the circuit node D serves as the power status signal (AC-OK signal).

Next, the overall operation of the power status signal generator circuit 24 will be explained with reference to FIGS. 3(a) and 3(b).

Referring to FIG. 3(a), during the period of t0 to t2, the amplitude of the input AC voltage is lower than the peak detection level. The output of the first voltage comparator U1 is thus LOW, and the voltage level at the circuit node C is driven HIGH. Therefore, the signal level of the power status signal at circuit node D is driven LOW, indicating the AC power source is not ready to supply a full-scale power. During the period of t2 to t3, the amplitude of the input AC voltage is higher than the peak detection level, causing the signal level at the circuit node B to become LOW. Meanwhile, the RC network start to charge the capacitor C1 through the charging loop of the supply voltage VCC1, capacitor C1 and resistor R10. The charging time of the capacitor C1 which is proportional to the time constant τ (the time constant τ is identical to the product of the resistance of the resistor R10 and the capacitance of the capacitor C1 (τ=RC)) will be quite short. This is because the resistance of the resistor R10 is selected to be low as 100Ω. Thus the voltage at the circuit node C will be driven LOW and is below the peak detection level, causing the power status signal to be driven HIGH, indicating the AC power source is normally working to supply a full-scale power. During the period of t3 to t4, the amplitude of the input AC voltage is dropped below the peak detection level, so that the signal level at the circuit node B will be returned to HIGH, causing the RC network to discharge the energy stored in the capacitor C1 through the discharging loop comprising the capacitor C1 and the resistors R9, R10. Because the time constant of the discharging process is far larger than that of the charging process (τ=RC, wherein the resistance R here is the sum of the resistance of R9 (28KΩ) plus the resistance of R10 (100Ω)), the discharging time will last longer than the charging time. However, the voltage level at the circuit node C is not possible to exceed the peak detection level, and the signal level of the power status signal remains at HIGH afterward. The later operations are exactly the repetitions of the operations during t2 to t3 and t3 to t4, hence they are not intended to dwelled upon here.

Figure 3B:
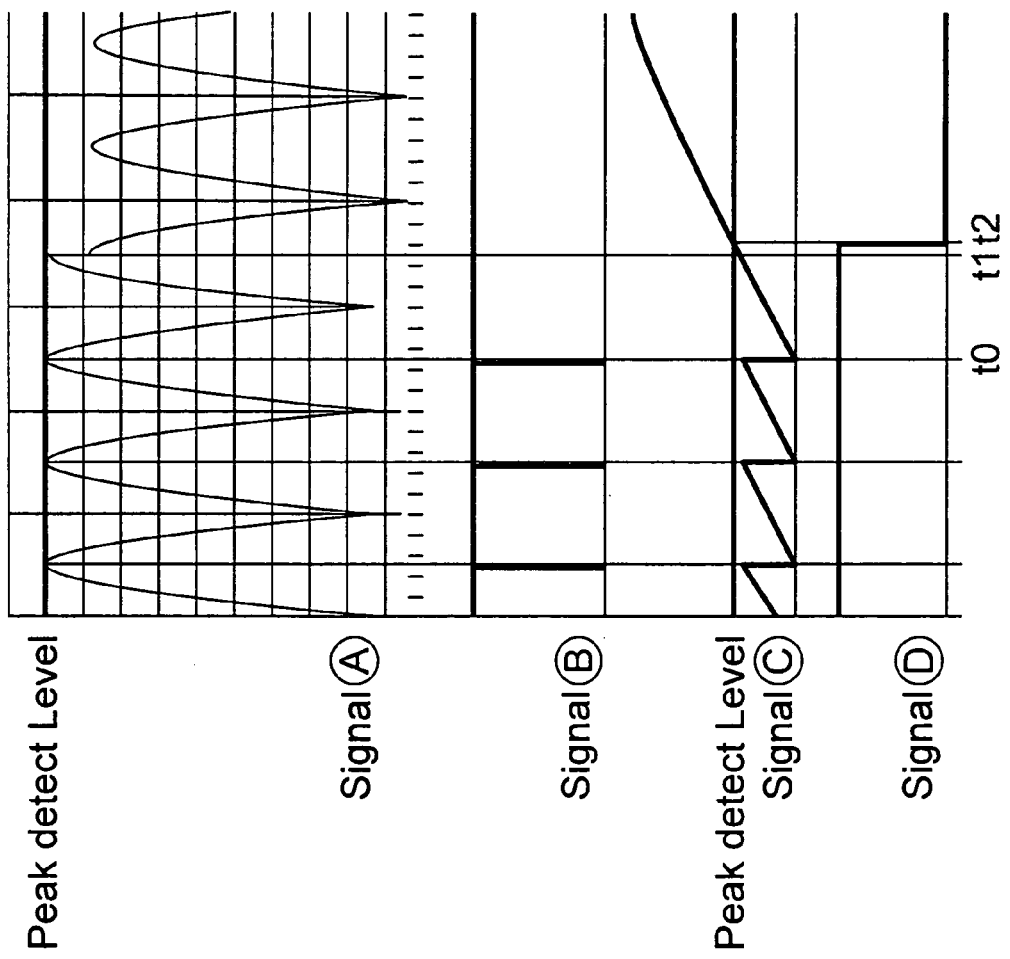
FIG. 3(b) is a timing diagram showing several signal waveforms measured at the circuit nodes within the power status signal generator circuit during the OFF period of the power status signal.

Referring to FIG. 3(b), wherein FIG. 3(b) is a timing diagram showing several signal waveforms measured at the circuit nodes within the power status signal generator circuit 24 during the OFF period of the power status signal according to an embodiment of the present invention. During the period of t0 to t1, the AC power source 21 is working normally, and the amplitude of the input AC voltage is slightly higher than the peak detection level, so that the signal level measured at the circuit node B will be driven on the point the input AC voltage reaches above the peak detection level, and the capacitor C1 continuously repeats its charging/discharging operation, wherein the relationship between its charging time and its discharging time is similar to that as discussed with reference to FIG. 3(a). The signal level of the power status signal remains HIGH because the voltage measured at the circuit node C does not exceed the peak detection level. During the period of t1 to t2, the peak value of the input AC voltage is dropped below the peak detection level, and the signal level measured at the circuit node B is HIGH afterward. Because the signal level measured at the circuit node B remains HIGH, the capacitor C1 will continue discharging afterward, and thus the signal level measured at the circuit node C will rise up exponentially. As long as the signal level measured at the circuit node C reaches above the peak detection level, the signal level measured at the circuit node D transits to LOW. The output signal transmitted through the circuit node D, that is, the power status signal, will change its state to indicate that the peak value of the input AC voltage has dropped below the peak detection level, which reveals that the AC power source is defective and can not supply a full-scale power to rest of the modular power supply system. Accordingly, the controller of the modular power supply system can monitor and detect the power supply status of the AC power source 11, and further determines if the actual cause of the defective system operation stems from the AC failure problem. As to the period set to detect the voltage sag problem, consider the worst case that the peak value of the input AC voltage is dropped below the peak detection level at the time to. Under this condition, the period set to detect the voltage sag problem is equal to a power supply cycle of the input AC voltage (t0–t1) plus the time period of t1 to t2. That is, in the worst case the maximum period set to detect the voltage sag problem is 10 microseconds plus an infinitesimal time period of t1 to t2, which is even lower than the period set to detect the voltage sag problem in the prior art.

In brief, the present invention provides a modular power supply system including a power status signal generator circuit that can monitor and detect the voltage sag of the input peak voltage in a short time, and generates an appropriate power status signal to the modular power supply system to indicate the AC failure condition promptly. By incorporating the power status signal generator circuit taught by the present invention into a prior art modular power supply system, the reliability of the power supply system will be greatly improved without effort.

While the present invention has been described in terms of what are presently considered to be the most practical and preferred embodiments, it is to be understood that the present invention needs not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A modular power supply system, comprising:
    a power source; and
    a power status signal generator circuit connected to the power source for detecting a peak value of an input voltage received from the power source and generating a power status signal indicating a power supply status of the power source, wherein the power status signal generator circuit includes a peak detector that detects a voltage sag of the peak value of the input voltage received from the power source, and wherein the peak detector comprises a first voltage comparator that compares the input voltage received from the power source with a predetermined reference voltage and sends an output signal according to a comparison result thereof, a resistor-capacitor network connected to the first voltage comparator and is configured to charge and discharge the capacitor according to the output signal of the first voltage comparator, wherein a charging time of the capacitor is shorter than a discharging time thereof, and a second voltage comparator connected to the resistor-capacitor network that compares a terminal voltage of the capacitor of the resistor-capacitor network with the predetermined reference voltage and generates the power status signal according to a comparison result thereof.

2. The modular power supply system of claim 1 further comprising:
    a bridge rectifier connected to the power source for converting an input voltage received from the power source into a rectified voltage; and
    a power converter connected to the bridge rectifier for receiving the rectified voltage and providing at least one constant voltage to a load device.

3. The modular power supply system of claim 2 wherein the bridge rectifier is a half-wave rectifier or a full-wave rectifier.

4. The modular power supply system of claim 2 wherein the power status signal generator circuit further comprising an attenuator connected to the bridge rectifier that proportionally downscales the rectified voltage received from the bridge rectifier.

5. The modular power supply system according to claim 4 wherein the power status signal generator circuit further comprising a hysteresis circuit connected between the attenuator and the peak detector for stabilizing the power status signal.

6. The modular power supply system according to claim 4 the power status signal generator circuit further comprising a voltage follower connected between the attenuator and the first voltage comparator for coupling a downscaled voltage provided by the attenuator to an input terminal of the first voltage comparator.

* * * * *